(12) United States Patent
Evans et al.

(10) Patent No.: US 6,775,991 B2
(45) Date of Patent: Aug. 17, 2004

(54) SUPER COOLER FOR A HEAT PRODUCING DEVICE

(75) Inventors: Nigel Evans, Sutton Coldfield (GB); William E. Hewlett, Burton on Trent (GB)

(73) Assignee: Light and Sound Design Ltd., Birmingham (GB)

( * ) Notice: Subject to any disclaimer, the term of this patent is extended or adjusted under 35 U.S.C. 154(b) by 0 days.

(21) Appl. No.: 10/375,165

(22) Filed: Feb. 25, 2003

(65) Prior Publication Data

US 2003/0131610 A1 Jul. 17, 2003

Related U.S. Application Data

(60) Continuation of application No. 10/128,774, filed on Apr. 22, 2002, now Pat. No. 6,523,353, which is a division of application No. 09/780,025, filed on Feb. 9, 2001, now Pat. No. 6,430,934.
(60) Provisional application No. 60/181,530, filed on Feb. 10, 2000.

(51) Int. Cl.[7] .................................................. F25B 21/02
(52) U.S. Cl. .............................. 62/3.2; 62/3.7; 62/259.2
(58) Field of Search ............................. 62/3.2, 3.3, 3.7, 62/299.2; 165/80.2, 80.3

(56) References Cited

U.S. PATENT DOCUMENTS

| | | | | |
|---|---|---|---|---|
| 4,848,090 A | * | 7/1989 | Peters ........................... | 62/3.3 |
| 5,097,829 A | * | 3/1992 | Quisenberry ................ | 128/400 |
| 5,515,682 A | * | 5/1996 | Nagakubo et al. ............ | 62/3.7 |
| 5,609,032 A | * | 3/1997 | Bielinski ...................... | 62/3.7 |
| 5,793,452 A | | 8/1998 | Miyawaki | |
| 5,912,773 A | | 6/1999 | Barnett et al. | |
| 5,953,151 A | * | 9/1999 | Hewlett ..................... | 359/291 |
| 6,012,291 A | * | 1/2000 | Ema ............................. | 62/3.7 |
| 6,098,408 A | | 8/2000 | Levinson et al. | |
| 6,208,087 B1 | * | 3/2001 | Hughes et al. .............. | 315/291 |
| 6,224,216 B1 | * | 5/2001 | Parker et al. ................ | 353/31 |

\* cited by examiner

*Primary Examiner*—Melvin Jones
(74) *Attorney, Agent, or Firm*—Fish & Richardson P.C.

(57) ABSTRACT

A super cooler device including a thermo electric cooler on a digital micro mirror device.

30 Claims, 3 Drawing Sheets

SUPER COOLER FOR A HEAT PRODUCING DEVICE

CROSS-REFERENCE TO RELATED APPLICATIONS

This application is a continuation of U.S. application Ser. No. 10/128,774, filed Apr. 22, 2002 now U.S. Pat. No. 6,523,353, which is a divisional of U.S. application Ser. No. 09/780,025, filed Feb. 9, 2001 now U.S. Pat. No. 6,430,934, which claims priority to U.S. application Ser. No. 60/181,530 filed Feb. 10, 2000.

SUMMARY

The present application relates to cooling of a heat producing device, using a thermoelectric cooler arranged as a super cooler. More specifically, the present application teaches cooling of a device, such as a digital mirror device, which requires a specified temperature gradient across the device, using a supercooled element.

BACKGROUND

Electronic devices often have specified cooling requirements. One device that has specific cooling requirements is a digital micromirror device ("DMD") available from Texas Instruments ("TI"). The manufacturer of this device has specified a maximum overall temperature for the device and also a specified maximum temperature gradient between the front and rear faces of the device during operation.

For example, the temperature of the specific DMD used in this application needs to be kept below 55° C., however, in this application it is desirable to keep the device at or-below ambient. This may allow operation in an ambient environment up to 55° C., such as may be encountered in a stage theater or studio environment. The temperature differential between the front and rear of the DMD cannot exceed 15°. Besides the heat from the operation of the DMD itself, large amounts of heat from a high intensity light source must be dissipated.

BRIEF DESCRIPTION OF THE DRAWINGS

These and other aspects will now be described in detail with reference to the accompanying, wherein.

DETAILED DESCRIPTION

According to the present system, a "supercooler" device, is used to monitor and control the temperature of a device which can control light on a pixel-by-pixel basis, e.g. a digital mirror device (DMD).

Figure 1:
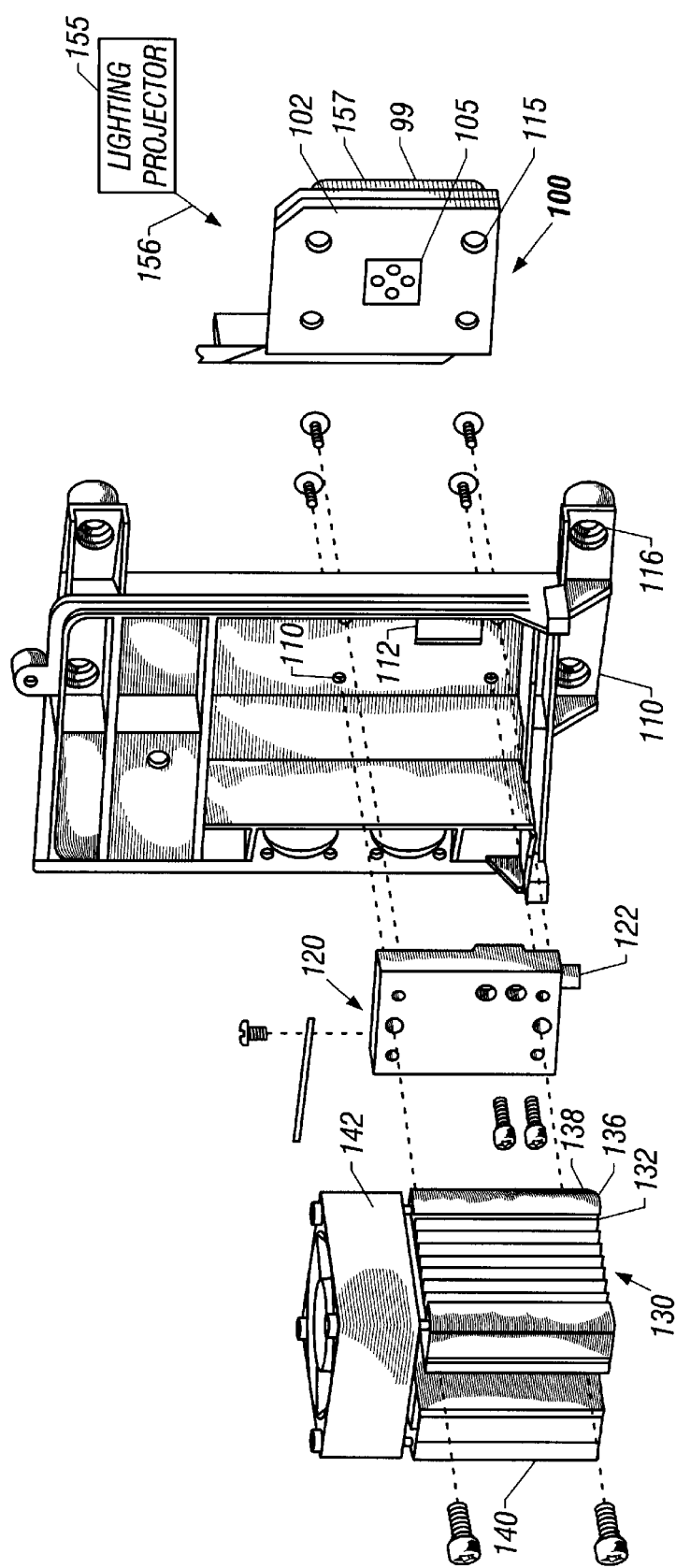
FIG. 1 shows an exploded diagram of the parts making up the supercooler assembly.

The mechanical structure of the supercooling assembly is shown in FIG. 1. The pixel element is a DMD 99, which forms part of a DMD assembly 100. As shown, a thermal connection 105 to the DMD 99 is provided.

A cold plate 120 is assembled to a mounting bracket 110 in a manner which allows minimal thermal transfer between the two components. The DMD is attached directly to the cold plate 120, hereby allowing maximum thermal transfer between the DMD and cold plate 120, but minimal thermal transfer to the mounting bracket 110. The rear surface of the cold plate 120 is directly connected to one side of the thermoelectric device 130, and the other side of the thermoelectric device is connected to a heat sink/fan assembly 140.

Insulating foam gaskets are fitted around the DMD rear stud, the cold plate, and the thermoelectric device in order to isolate them from the outside ambient air. This improves the efficiency of the cooling system by eliminating the effects of condensation and properly controlling the flow of heat from the DMD to the cold plate, through the thermoelectric device, and into the heat sink/fan assembly.

The thermoelectric cooler element 130 operates as conventional to produce one cold side 131 and one hot side 132. The hot side is coupled to the heat sink/fan assembly 140 to dissipate the heat. In a preferred mode, the heat sink/fan assembly is columnar is shape, with a substantially square cross section. This facilitates using a square shaped fan housing 142. The square shaped fan unit allows the maximum use of the space for a fan, whose blades usually follow a round shape. Any type of cooling fan, however can be used.

The DMD assembly 100 has an extending rear stud 105 which is covered with thermal grease. This stud extends though a hole 112 in the bracket assembly 110.

The plate 120 is actively cooled, and hence becomes a "cold plate". The active cooling keeps the metal plate at a cooled temperature, and the thermal characteristics of the plate material allow the heat flowing into the plate from the DMD to be evenly distributed throughout the entire plate. The plate is preferably about ¼" to ⅜" in thickness, and of comparable outer size to the thermal contact area of the thermoelectric cooler element 130. This allows the localized and concentrated heat at the rear stud of the DMD to be evenly dissipated through the cold plate and then efficiently transferred through the full surface area of the thermoelectric cooler element. As shown, the assembly employs thermal insulation techniques such as fiber/plastic sleeves and washers in the mounting of components, in order to prevent heat transfer via mounting screws etc. Since this heat transfer could be uncontrolled, it could otherwise reduce the cooling efficiency.

Figure 2:
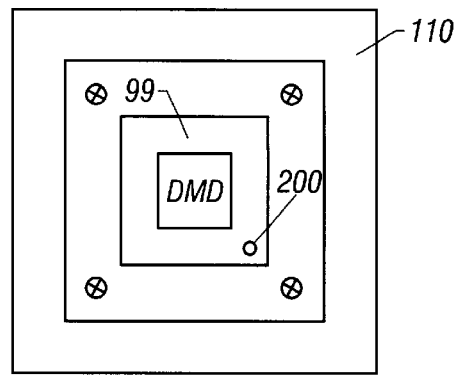
FIG. 2 shows the rear of the DMD and parts which are assembled to the DMD.

The front of the DMD is shown in FIG. 2. Temperature sensor 200 is mounted to have a fast response to temperature changes. A second temperature sensor 122 is mounted to the cold plate 120 and effectively measures the temperature of the rear of the DMD 99. This second temperature sensor 122 therefore monitors the back temperature.

The hot side 132 of the thermoelectric cooler is coupled to a heat sink assembly 130. The heat sink assembly 140 includes a heat sink element 140. As shown, the device has fins and a top-located cooling fan 142.

Figure 3:
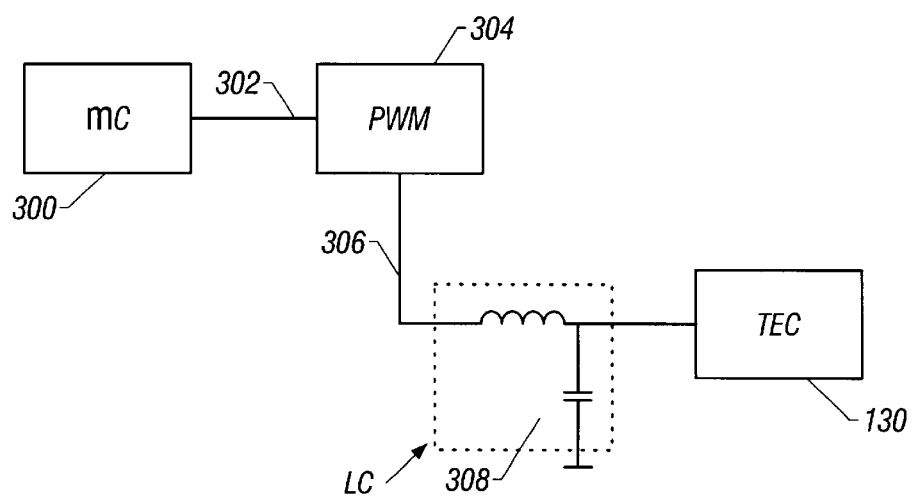
FIG. 3 shows a circuit for driving a thermoelectric cooler.

A block diagram of the control system is shown in FIG. 3. Controller 300 operates in a closed loop mode to maintain a desired temperature differential across the sensors 122, 200.

One important feature of the present application is that the thermoelectric cooler is controlled to maintain the temperature of the DMD at the desired limits. These limits are set at a target of 16° C. on the front, and a differential no greater than 15° between front and rear. The thermoelectric cooler is controlled using very low frequency or filtered pulse width modulation. In a first embodiment, the controlling micro controller 300 produces an output 302, e.g., digital or analog. This drives a pulse width modulator 304. The output of the pulse width modulator is a square wave 306 or a signal close to a square wave, with sufficient amplitude and power to produce the desired level of cooling down the thermoelectric cooler. The square wave is coupled to an LC filter 308 which has a time constant effective to smooth the 20 KHz switching frequency. The output to the thermoelectric cooler is therefore a DC signal. This drives the thermoelectric cooler 130 and causes it to produce a cooling output. In a second embodiment, the LC filter is removed and the TEC is driven directly by the square wave 306 at a lower frequency, e.g. 1 Hz.

Figure 4:
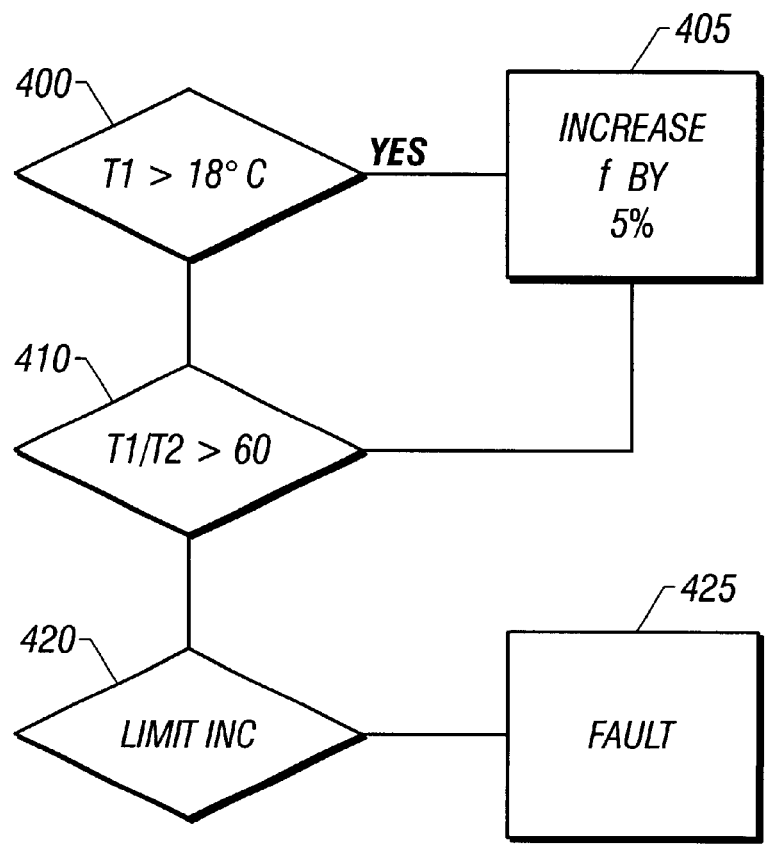
FIG. 4 shows a flowchart of operation.

The microcontroller operates according to the flowchart of FIG. 4. Step 400 determines if the temperature of the first temperature sensor T1 is greater than 16°. If so, the output to the TEC remains "on", resulting in further cooling. When the temperature falls below 16°, the drive to the TEC is switched off. The sample period is approximately ½ second between samples.

At 410, the system checks temperature of the first sensor (T1) and of the second sensor (T2) to determine if the differential is greater than 15°. If so, the output is switched "on". Step 420 indicates a limit alarm, which represents the time of increase if the rate of change continues. If the rate of change continues to increase, as detected at step 420, a fault is declared at step 425. This fault can cause, for example, the entire unit to be shut off, to reduce the power and prevent permanent damage.

Other embodiments are contemplated.

What is claimed:

1. A system, comprising:
    a mounting plate, having mounting holes at locations and having sizes which are adapted for mounting a digital mirror device, said mounting plate also having an opening sized to receive a heat stud of the digital mirror device attached therethrough; and
    a cooled plate, thermally coupled to said heat stud, and actively cooled to thereby cool the heat stud of the digital minor device while minimizing an amount of heat transfer to the mounting plate.

2. A system as in claim 1, wherein said cooled plate includes a fan and heatsink assembly, coupled to a surface of said cooled plate, operating to remove heat from said cooled plate.

3. A system as in claim 1, wherein said cooled plate includes an active cooling unit, which produces a cooling amount based on applied electrical energy.

4. A system as in claim 3, wherein said active cooling unit includes a thermoelectric unit.

5. A system as in claim 1, further comprising a digital mirror device, connected to said mounting plate, and having said stud extending through said opening.

6. A system as in claim 5, further comprising thermal insulation elements, which thermally insulate portions of said digital mirror device from ambient air.

7. A system as in claim 4, further comprising thermal insulation between said digital mirror device and said mounting plate.

8. A system comprising:
    a digital mirror device;
    a mounting assembly for said digital mirror device;
    a cooling assembly for only a rear side of said digital mirror device;
    a control system, which controls said cooling assembly, to control at least one aspect of cooling of said cooling assembly; and
    wherein said cooling assembly includes a metal plate which is actively cooled.

9. A system as in claim 8, wherein said control system controls a temperature of said cooled plate.

10. A system as in claim 9, wherein said cooling assembly includes an electrically controllable cooler.

11. A system as in claim 10, wherein said electrically controllable cooler includes a thermoelectric cooler.

12. A system, comprising:
    a digital mirror device, having a first mounting surface; and a second optically active surface; and
    a cooling part for said digital mirror device including at least a heatsink and a fan, said fan being mounted to force air across said heat sink to cool said heat sink, and to blow the heated air only in a direction that is away from both said first and second surfaces of said digital mirror device.

13. A system as in claim 12, wherein said cooling part is thermally coupled to said digital mirror device.

14. A system comprising:
    a digital mirror device, having a first mounting surface; and a second optically active surface;
    a cooling part for said digital mirror device including at least a heatsink and a fan, said fan being mounted to blow in a direction that is away from both said first and second surfaces of said digital mirror device; and
    a metal plate, thermally coupled between said cooling part and said digital mirror device, said thermal plate being cooled by said cooling part.

15. A system as in claim 12, further comprising a control system, which controls an amount of cooling of said cooling part.

16. A system as in claim 15, wherein said cooling part includes an active cooler, which produces an amount of cooling that is proportional to an amount of applied electricity.

17. A system as in claim 16, where in said control system controls an amount of cooling by said active cooler.

18. A system as in claim 16, further comprising a metal plate, thermally coupled between said cooling part and said digital mirror device, said thermal plate being cooled by said cooling part, and wherein said control system controls an amount of cooling by said cooling part to thereby effectively control a temperature of the metal plate.

19. A system, comprising:
    a digital mirror device, having a front optically active surface and a rear surface;
    a metal plate, thermally coupled to said rear surface, and thermally in contact with a heated part of said rear surface; and
    a temperature controlling part, actively maintaining a temperature of said metal plate at a specified amount.

20. A system as in claim 19, further comprising an active cooler, included in said temperature controlling part, which produces an amount of cooling that is proportional to an amount of applied electricity.

21. A system as in claim 19, wherein said active cooler also includes a heatsink and fan, said fan mounted to blow air away from said digital mirror device.

22. A method, comprising:
    operating a digital mirror device; and
    actively cooling said digital mirror device using an active cooler which produces cooling effect in proportion to an amount of applied electricity.

23. A method as in claim 22, wherein said active cooler is a thermoelectric cooler.

24. A method as in claim 22, wherein said active cooling comprises providing a metal plate in thermal contact with said digital mirror device, and actively cooling said thermal plate to maintain said thermal plate in a desired thermal state.

25. A method as in claim 22, wherein said active cooler includes an electrical cooling device, and a heatsink which dissipates heat from said electrical cooling device.

26. A method as in claim 22, further comprising monitoring a temperature of said digital minor device.

27. A method, comprising:

operating a digital mirror device which has a front surface and a rear surface;

cooling only one surface of said digital mirror device; and monitoring temperatures of both surfaces of said digital mirror device.

28. A method as in claim 27, further comprising controlling said cooling to maintain a desired temperature differential between said surfaces of said digital mirror device.

29. A method as in claim 27, wherein said cooling comprises active cooling using an electrically controllable cooler that produces an amount of cooling proportional to an amount of electricity applied thereto.

30. A method as in claim 29, wherein said monitoring temperatures comprises monitoring temperatures of said surfaces, and controlling said amount of electricity based on said temperatures.

* * * * *